United States Patent [19]
Funaki et al.

[11] Patent Number: 5,592,014
[45] Date of Patent: *Jan. 7, 1997

[54] HIGH BREAKDOWN VOLTAGE SEMICONDUCTOR DEVICE

[75] Inventors: Hideyuki Funaki, Tokyo; Akio Nakagawa, Hiratsuka; Norio Yasuhara, Yokohama; Tomoko Matsudai, Tokyo; Yoshihiro Yamaguchi, Urawa; Ichiro Omura, Yokohama, all of Japan

[73] Assignee: Kabushiki Kaisha Toshiba, Kawasaki, Japan

[ * ] Notice: The term of this patent shall not extend beyond the expiration date of Pat. No. 5,072,287.

[21] Appl. No.: 484,864

[22] Filed: Jun. 7, 1995

Related U.S. Application Data

[63] Continuation-in-part of Ser. No. 85,056, Jul. 2, 1993, Pat. No. 5,438,220, which is a continuation-in-part of Ser. No. 829,214, Jan. 31, 1992, Pat. No. 5,343,067, which is a continuation-in-part of Ser. No. 642,565, Jan. 18, 1991, Pat. No. 5,241,210, which is a continuation-in-part of Ser. No. 236,746, Aug. 26, 1988, abandoned, which is a continuation-in-part of Ser. No. 161,102, Feb. 26, 1988, abandoned.

[30] Foreign Application Priority Data

| Feb. 26, 1987 | [JP] | Japan | 62-043564 |
| Jul. 29, 1987 | [JP] | Japan | 62-189420 |
| Jul. 4, 1988 | [JP] | Japan | 63-166403 |
| Jan. 31, 1991 | [JP] | Japan | 3-031720 |
| Mar. 28, 1991 | [JP] | Japan | 3-090068 |
| Apr. 16, 1991 | [JP] | Japan | 3-109605 |
| Sep. 20, 1991 | [JP] | Japan | 3-268970 |
| Jul. 2, 1992 | [JP] | Japan | 4-175777 |
| Mar. 11, 1993 | [JP] | Japan | 5-050534 |
| May 22, 1995 | [JP] | Japan | 7-122635 |

[51] Int. Cl.[6] .................................................. H01L 23/58
[52] U.S. Cl. ........................... 257/487; 257/409; 257/506
[58] Field of Search ................................ 257/487, 506, 257/285, 366, 408, 409, 401, 220, 545, 492

[56] References Cited

U.S. PATENT DOCUMENTS

| 4,807,012 | 2/1989 | Bcasom | 257/524 |
| 5,072,287 | 10/1991 | Nakagawa et al. | 257/525 |

*Primary Examiner*—William Mintel
*Assistant Examiner*—Roy Potter
*Attorney, Agent, or Firm*—Oblon, Spivak, McClelland, Maier & Neustadt, P.C.

[57] ABSTRACT

A high breakdown voltage semiconductor apparatus comprises a substrate having an insulating layer formed thereon, a high resistance semiconductor layer of a first conductivity type formed on said insulating layer, a base region of the first conductivity type formed selectively in a surface region of the high resistance semiconductor layer, a drift region of a second conductivity type formed selectively in the surface region of the high resistance semiconductor layer so as not to reach the insulating layer, a source region of the second conductivity type formed in the base region, a drain region formed in the drift region, a gate electrode formed on a region between the source region and the drift region, with a gate insulating film interposed between the gate electrode and the region between the source region and the drift region, a source electrode provided in contact with the base region and the source region, a drain electrode provided in contact with the drain region. The dosage of impurities in the high resistance semiconductor layer is $2\times10^{12}$ cm$^{-2}$ to $3\times10^{12}$ cm$^{-2}$ and the dosage of impurities in the drift layer is $1\times10^{12}$ cm$^{-2}$ to $2\times10^{12}$ cm$^{-2}$.

10 Claims, 9 Drawing Sheets

○ DIFFUSION IN WELL

◎ FORMATION OF TRENCH

◎ N, P-BUFFER IMPLANTATION

● FIELD IMPLANTATION

◎ SHALLOW P⁺ IMPLANTATION

◎ FIELD OXIDATION

○ R POLYSILICON DEPOSITION

◎ CHANNEL IMPLANTATION

◎ GATE OXIDATION

◎ GATE DEPOSITION OF POLYSILICON

◎ BASE IMPLANTATION

◎ N⁺ IMPLANTATION

◎ P⁺ IMPLANTATION

◎ : STEP COMMON TO LOGIC PORTION AND HIGH BREAKDOWN VOLTAGE DEVICE

○ : STEP FOR LOGIC PORTION ALONE

● : STEP FOR P CHANNEL DEVICE ALONE

FIG. 8

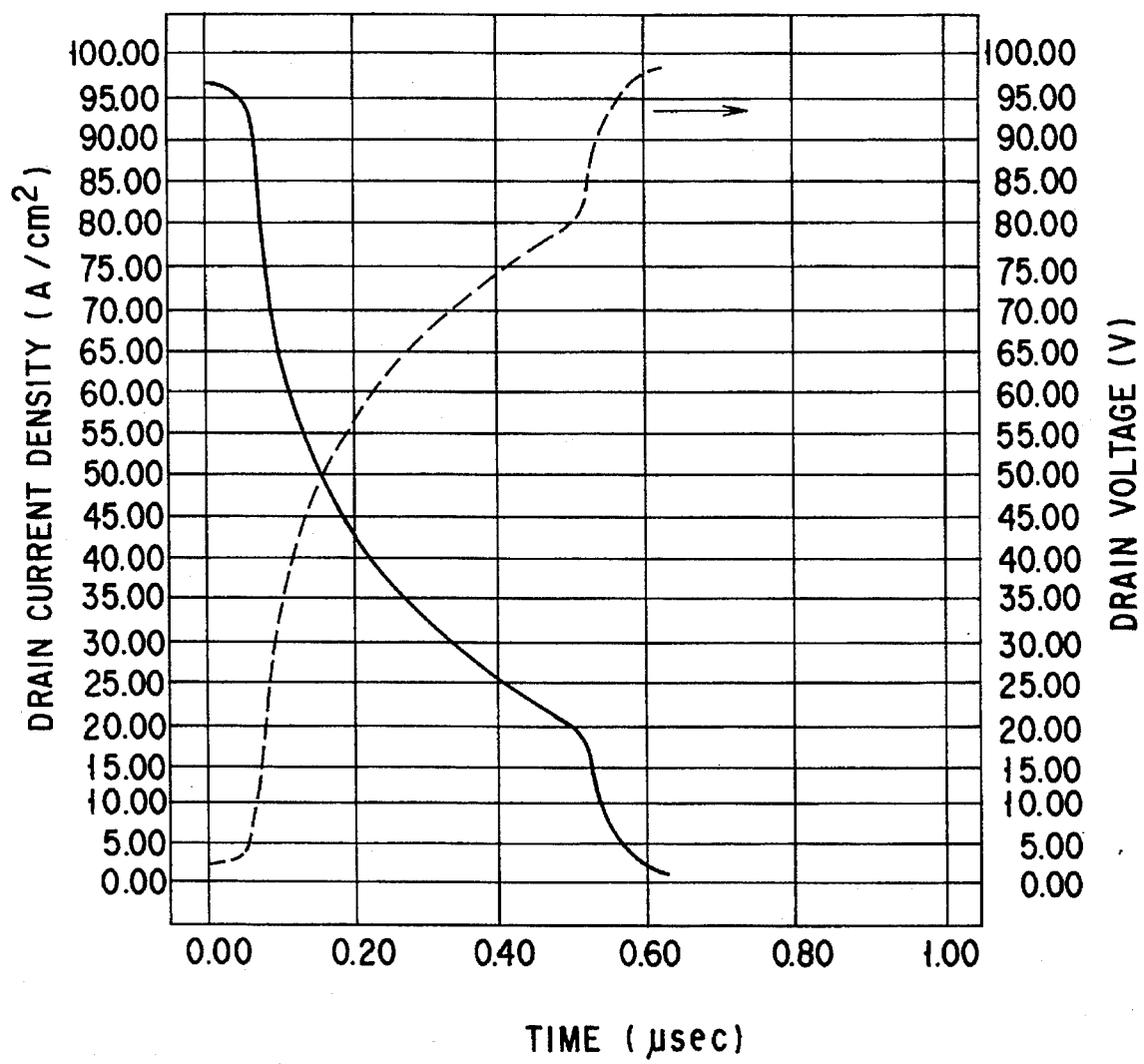
F I G. 14

15,592,014

HIGH BREAKDOWN VOLTAGE SEMICONDUCTOR DEVICE

CROSS-REFERENCE TO THE RELATED APPLICATION

This is a continuation-in-part of application No. 08/085,056, filed Jul. 2, 1993, now U.S. Pat. No. 5,438,220 which is in turn a continuation-in-part of application No. 07/829,214, filed Jan. 31, 1992, now U.S. Pat. No. 5,343,067 which in turn is a continuation-in-part of application No. 07/642,565, filed Jan. 18, 1991, now U.S. Pat. No. 5,241,210 which in turn is a continuation-in-part of application No. 07/236,746, filed Aug. 26, 1988, and now abandoned, which in turn is a continuation-in-part of application No. 07/161,102, filed Feb. 26, 1988, and now abandoned.

BACKGROUND OF THE INVENTION

1. Field of the Invention

The present invention relates to a high breakdown voltage semiconductor device.

2. Description of the Related Art

In a high breakdown voltage semiconductor device, dielectric isolation method is known an an effective method of isolating each element.

FIG. 1 shows a conventional high breakdown voltage diode obtained by using such a dielectric isolation method. Reference numeral 101 denotes a $p^+$ type silicon substrate, and there is formed a substrate wafer in which the $p^+$type silicon substrate and an $n^-$ (or $p^-$) type silicon substrate are bonded to each other by a direct bonding method. Reference numeral 102 is an oxide film of a bonding interface. The $n^-$ type substrate of the substrate wafer is selectively etched up to the depth reaching the oxide film 102, so that a groove is formed. Thereby, an $n^-$ type layer 103, which is an island element region, is formed. In the groove, an oxide film 104 is formed inside and a polycrystalline silicon film 105 is buried therein. An $n^+$ type layer 106, serving as a cathode region, is formed in the central surface portion of the island $n^-$ type layer 103 isolated from other portions by the oxide films 102 and 104. Then, $p^+$ type layer 107, serving as an anode region, is formed in the peripheral surface portion. As result, a diode is formed. $P^+$ layers 108 and 109 are formed along the oxide films 102 and 104 so as to enclose the surroundings of the island $n^-$ type layer 103. The $p^+$ type layers 108 and 109 are formed so as to allow large current to flow. A cathode electrode 110 and an anode electrode 111 are formed on the $n^+$ type layer 106 and $p^+$ type layer 107, respectively.

In the above diode, if reverse bias is applied to the portion between the anode and the cathode and a depletion layer extends to the $n^-$ type layer 103, and all applied voltages are applied between the $n^+$ type layer 106 of the surface portion and the $p^+$ type layer 108 of the bottom portion. Therefore, in order to obtain a diode having sufficient high breakdown voltage, it is required that a distance d between the $n^+$ type layer 106 and the $p^+$ type layer 108 be sufficiently largely made. More specifically, in order to obtain voltage of 600V, $d=45$ μm is needed.

If the thickness of the $n^-$ type layer 103 is made larger so as to ensure the above-mentioned distance d, the groove for the element isolation in a lateral direction must be deepened in accordance with the thickness of the $n^-$ type layer 103. This makes it extremely difficult to perform the element isolation in the lateral direction.

As mentioned above, according to the semiconductor device having the conventional dielectric isolation structure, it is necessary to make the thickness of the high resistance semiconductor layer whose depletion layer extends sufficiently large so as to obtain a sufficient high breakdown voltage. Due to this, there is a problem that the element isolation becomes difficult to be performed.

The following explains the other examples of the semiconductor device having the conventional dielectric isolation structure.

FIG. 2 shows a conventional lateral type diode having the conventional dielectric isolation structure. An $n^-$ type silicon layer (active layer) 133 is formed on a semiconductor substrate 131 via an insulating film 132 for isolation. An $n^+$ type layer 134 having a high impurity concentration is formed in the bottom portion of the active layer 133. A p-type anode layer 135 is formed in the active layer 133 and an n-type cathode layer 136 is formed in a portion which is away from the p-type anode layer 135 with a predetermined distance, and an anode electrode 137 and a cathode electrode 138 are formed on the anode layer 135 and the cathode layer 136, respectively.

In the above-mentioned lateral type diode, for example, considering a reverse bias state in which the anode electrode 137 and the substrate 131 are grounded and a positive voltage is applied to the cathode electrode 138, the voltage to be applied to the cathode is applied to the depletion layer extending to the active layer under the p-type anode layer 137, and the insulation film 132 for isolation.

Due to this, if the thickness of the active layer 133 under n-type cathode layer 136 is thin, a large electric field is shared at this portion, and an electric field concentration occurs in the vicinity of the curved portion of the bottom of the n-type cathode layer 136, and avalanche breakdown is generated at a low applied voltage. In order to avoid the above problem and realize the sufficient high breakdown voltage, the thickness of the active layer 133 is conventionally set to be 40 μm or more.

However, if the thickness of the active layer is large, a deep isolation groove is needed for the element isolating in the lateral direction by a V-groove, and an area of the isolation groove reaction becomes large. Due to this, work processing becomes difficult and an effective area of the element becomes small, so that the cost of an integrated circuit having the high breakdown voltage element increases.

As mentioned above, in the high breakdown voltage semiconductor device having the conventional dielectric isolation structure, if the active layer is thin, a sufficient breakdown voltage cannot be obtained. Moreover, if the active layer is thick, the element isolation in the lateral direction becomes difficult.

On the other hand, there is known a conventional power IC in which a high breakdown voltage element such as a high breakdown voltage driving circuit and a low breakdown voltage device such as a low breakdown voltage control circuit are formed on a single substrate. There are various uses of this conventional power IC. For example, an inverter circuit may be produced by using p-channel FETs or IGBTs as high breakdown voltage devices, thereby simplifying a level shifter or a high-side gate circuit.

However, because of structural limitations of the device, the high breakdown voltage driving circuit and low breakdown voltage control circuit cannot be manufactured by a common process. Thus, one of them is first formed, and then the other. For example, in the prior art, when a p-channel high breakdown voltage MOSFET is fabricated, a deep p type well is formed, as in a DMOS, and the device is formed therein. Thus, there is no steps common to those of the process of forming a logic portion. Consequently, the number of steps, the time for manufacture and the manufacturing cost increase.

In addition, in the conventional high breakdown voltage MOSFET, the breakdown voltage decreases if the dosage of impurities in the active region is increased to reduce the turn-on resistance.

SUMMARY OF THE INVENTION

In order to solve the above-mentioned problems, an object of the present invention is to provide a semiconductor device having high breakdown voltage using the dielectric isolation structure wherein a sufficiently high breakdown voltage can be obtained even if a relative thin high resistance semiconductor layer is used.

Another object of the present invention is to provide a high breakdown voltage semiconductor apparatus wherein a high breakdown voltage driving circuit and a low breakdown voltage control circuit are simultaneously formed, thereby greatly reducing the manufacturing cost and decreasing the turn-on resistance while maintaining a high breakdown voltage.

According to the present invention, there is provided a high breakdown voltage semiconductor apparatus comprising:

a substrate having an insulating layer formed thereon;

a high resistance semiconductor layer of a first conductivity type formed on said insulating layer;

a base region of a second conductivity type formed selectively in a surface region of said high resistance semiconductor layer;

a source region of the first conductivity type formed in said base region;

a drain region formed in said high resistance semiconductor layer;

a gate electrode formed on a region between said source region and said drain region, with a gate insulating film interposed between said gate electrode and said region between said source region and aid drain region;

a source electrode provided in contact with said base region and said source region; and a drain electrode provided in contact with said drain electrode region, wherein a high resistance semiconductor region of the second conductivity type is provided between said insulating layer and said high resistance semiconductor layer of the first conductivity type, and said base region reaches said high resistance semiconductor region of the second conductivity type.

According to the present invention, there is also provided a high breakdown voltage semiconductor apparatus comprising:

a substrate having an insulating layer formed thereon;

a high resistance semiconductor layer of a first conductivity type formed on said insulating layer;

a base region of the first conductivity type formed selectively in a surface region of said high resistance semiconductor layer;

a drift region of a second conductivity type formed selectively in the surface region of said high resistance semiconductor layer so as not to reach said insulating layer;

a source region of the second conductivity type formed in said base region;

a drain region formed in said drift region;

a gate electrode formed on a region between said source region and said drift region, with a gate insulating film interposed between said gate electrode and said region between said source region and said drift region;

a source electrode provided in contact with said base region and said source region;

a drain electrode provided in contact with said drain region, wherein the dosage of impurities in said high resistance semiconductor layer is $2 \times 10^{12}$ cm$^{-2}$ to $3 \times 10^{12}$ cm$^{-2}$ and the dosage of impurities in said drift layer is $1 \times 10^{12}$ cm$^{-2}$ to $2 \times 10^{12}$ cm$^{-2}$.

Furthermore, according to the present invention, there is provided a high breakdown voltage semiconductor apparatus comprising:

a substrate having an insulating layer formed thereon;

a high resistance semiconductor layer of a first conductivity type formed on said insulating layer;

a base region of the first conductivity type formed selectively in a surface region of said high resistance semiconductor layer;

a drift region of a second conductivity type formed selectively in the surface region of said high resistance semiconductor layer so as not to reach said insulating layer;

a source region of the second conductivity type formed in said base region;

a buffer layer of the second conductivity type formed in said drift region;

a drain region of the first conductivity type formed in said buffer region;

a gate electrode formed on a region between said source region and said drift region, with a gate insulating film interposed between said gate electrode and said region between said source region and said drift region;

a source electrode provided in contact with said base region and said source region;

a drain electrode provided in contact with said drain region, wherein the dosage of impurities in said high resistance semiconductor layer is $2 \times 10^{12}$ cm$^{-2}$ to $3 \times 10^{12}$ cm$^{-2}$ and the dosage of impurities in said drift layer is $1 \times 10^{12}$ cm$^{-2}$ to $2 \times 10^{12}$ cm$^{-2}$.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 shows a flow of manufacturing steps for fabricating the high breakdown voltage MOSFET shown in FIG. 7 simultaneously with a logic portion;

FIG. 14 is a graph showing the switching waveform of the IGBT shown in FIG. 12.

DETAILED DESCRIPTION OF THE PREFERRED EMBODIMENTS

In a high breakdown voltage MOS semiconductor apparatus according to a first aspect of the present invention, a lateral type MOS semiconductor device is formed on an SOI substrate obtained by directly bonding two substrates to each other. Specific examples of the MOS semiconductor apparatus will now be described with reference to FIGS. 3 to 6.

Figure 1:
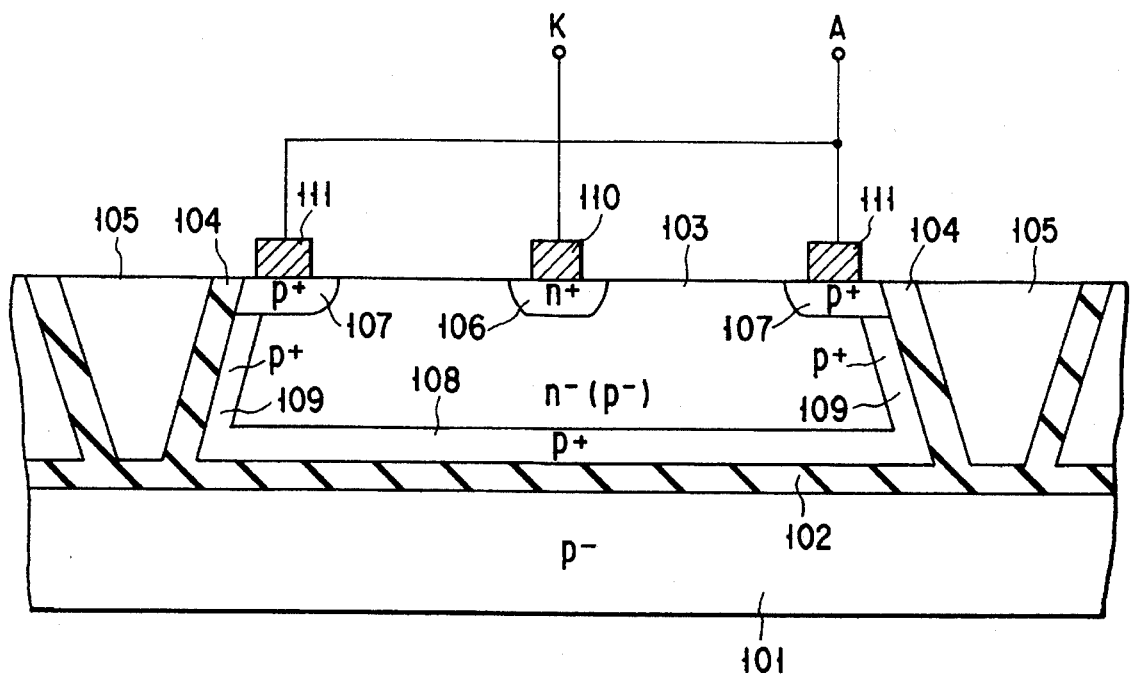
FIGS. 1 and 2 are cross sectional views showing a conventional high breakdown voltage diode.
Figure 2:
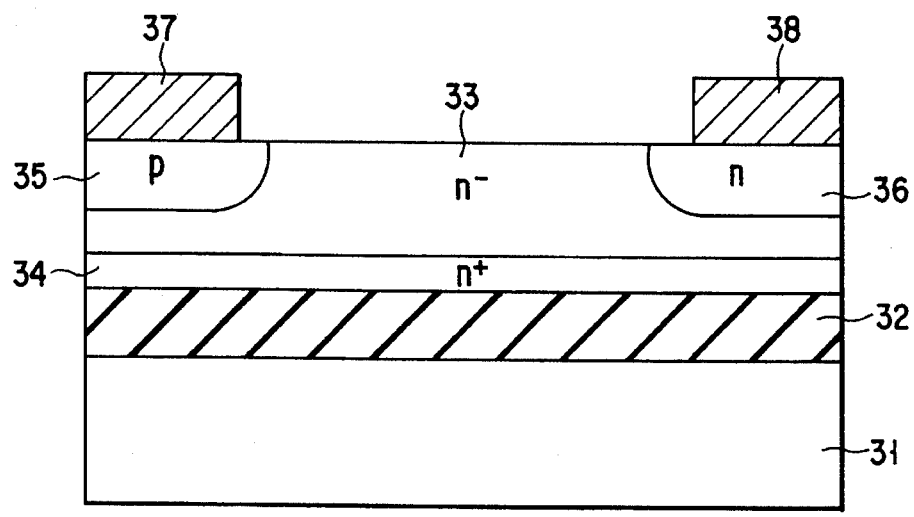
Figure 3:
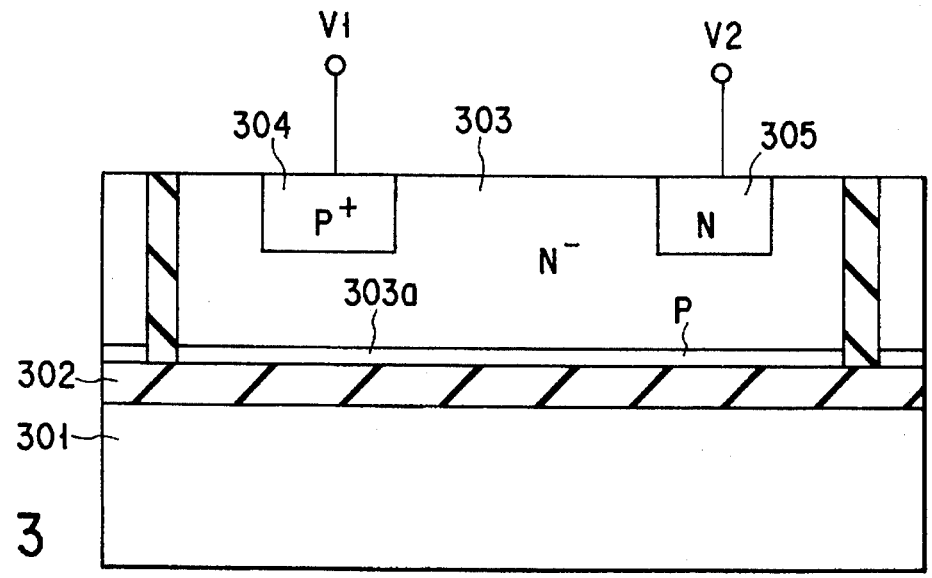
FIG. 3 is a view showing a diode relating a first embodiment of the present invention.

FIG. 3 is a lateral type diode relating to the embodiment of the present invention. The n⁻ type high resistance silicon layer (active layer) 303 is formed on the silicon substrate 301 through the silicon oxide film (first insulating film) 302. The thickness of the silicon oxide film 302 is about 1 to 5 μm. The n-type active layer 303 has the total amount of impurities of $1.0 \times 10^{10}/cm^2$ to $2.0 \times 10^{12}/cm^2$, preferably $0.5 \times 10^{12}$ to $1.8 \times 10^{12}/cm^2$. The p type anode layer 304 having high impurity concentration and the n type cathode layer 305 having high impurity concentration are formed in the active layer 303 to be separated from each other with a predetermined distance. The p type anode layer 304 and the n type cathode layer 305 are formed to have the depth which does not reach to the silicon oxide film 302 as shown in the drawing. If voltage $V_1$ and voltage $V_2$ are applied to the p type anode layer 304 and the n type cathode layer 305, respectively, and voltages $V_1$ and $V_2$ are higher than the voltage Vsub of the silicon substrate 301, a p type channel region 303a is formed in the bottom portion of the high resistance silicon layer 303. Since the p⁻ type channel region 303a has positive charge, capacitance is formed together with the substrate 301. Thereby, influence of the potential of the substrate 301 is shielded, and the high resistance silicon layer 303 is prevented from being depleted.

Figure 4:
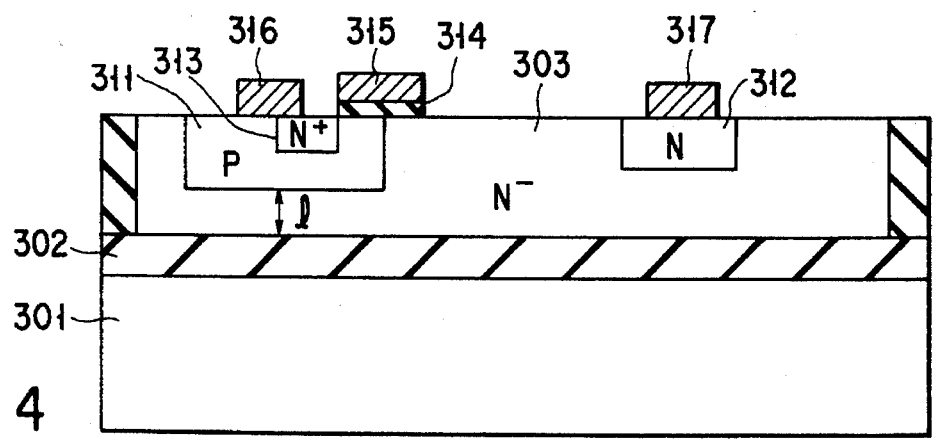
FIG. 4 is a view showing a MOSFTT relating to the other embodiment of the present invention.
Figure 5:
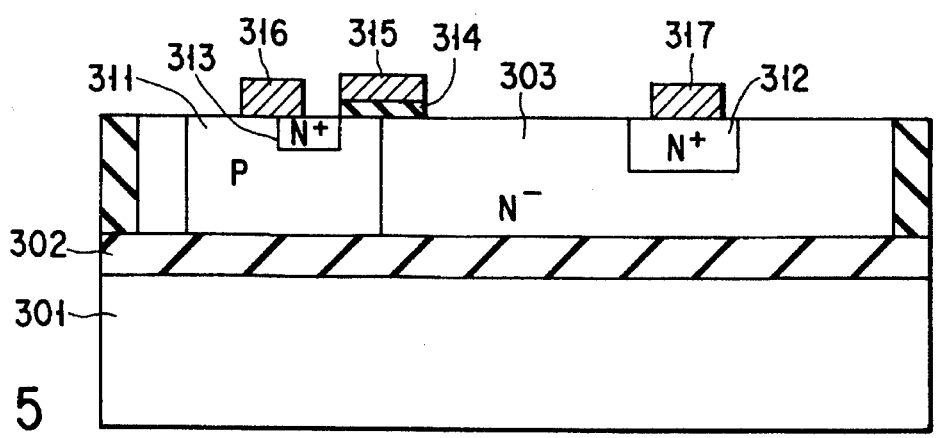
FIG. 5 is a view showing a MOSFTT of an embodiment in which the structure of FIG. 4 is modified.

FIG. 4 is a MOSFET showing other example in which the p⁻ type channel region 303a shown in FIG. 123 is formed. The n⁻ type active layer 303 is formed on the substrate 301 through the silicon oxide film 302. The p type base layer 311 and the n type drain layer 312 are formed in the active layer 303. The p type base layer 311 and the n type drain layer 312 are formed to have the depth which does not reach to the silicon oxide film 302.

The n type source layer 313 is formed in the p type base layer 311, and the surface portion of the p type base layer 311, which is sandwiched between the n type source layer 313 and the n⁻ type active layer 303, is used as a channel region, and the gate electrode 315 is formed on the channel region through the gate oxide film 314 having a thickness of about 60 nm.

The MOSFET shown in FIG. 4 is used as a switch on the high potential side of the circuit. If the MOSFET is turned on, both source potential and the drain potential become high potential to the substrate 301. In this case, if the influence of the potential of the substrate 301 is not shielded, the active layer 303 is depleted, and on resistance of the MOSFET becomes extremely high.

However, the distance l between the p type base layer 311 and the oxide film 302 and impurity concentration of the p type base layer 311 are suitably selected, a hole is injected from the p type base layer 311 and the p⁻ channel region is formed in the bottom portion of the active layer 303 when the source potential $V_1$ is a certain constant value or more. Thereby, the active layer 303 is prevented from being depleted.

In this case, the source potential Vp to form the p⁻ type channel region can be obtained from the following equation.

$$V_p = qC_N l^2 / 2\epsilon$$

wherein (q: $1.6 \times 10^{-19}$ C) CN: N type impurity concentration and ε: dielectric constant ($1.05 \times 10^{-12}$ F/cm).

VP is preferably 10V or less. That is, $l^2 \leq 20\epsilon/qC_N$.

In order to set VP to zero, the distance l may be changed to 0. In other words, the structure shown in FIGS. 5 and 6 may be used.

Figure 6:
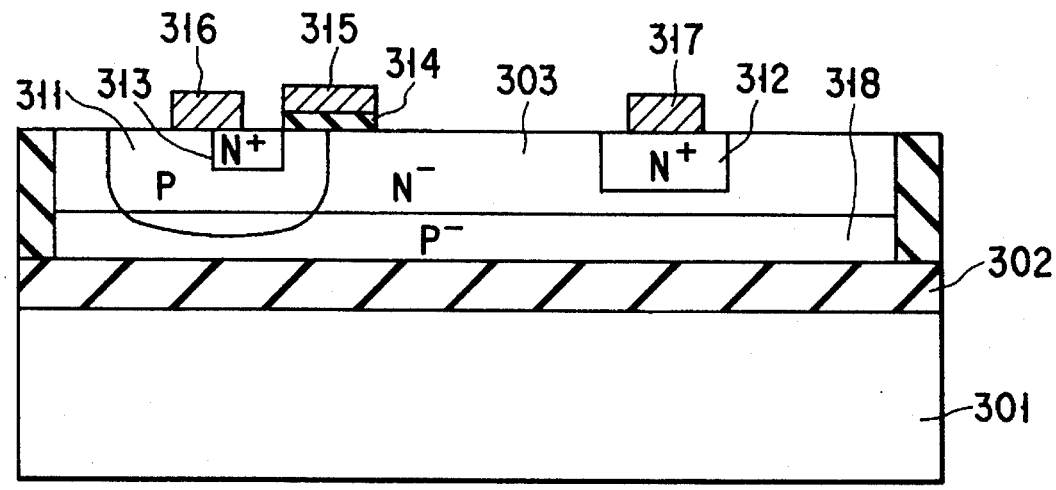
FIG. 6 is a view showing a MOSFET of an embodiment in which the structure of FIG. 4 is modified.

In a device shown in FIG. 6, a p⁻ type layer 318 is provided between an n⁻ type active layer 303 and an oxide film 302. A p type base layer 311 reaches the p⁻ type layer 318. The device shown in FIG. 6 is an n⁻ channel type MOSFET. However, the present invention is applicable to a p-channel type MOSFET in which the conductivity type is reversed.

A high breakdown voltage semiconductor apparatus according to a second aspect of the invention, a shallow drift region of a second conductivity type is formed on an SOI substrate of a first conductivity type. With this structure, as compared to a structure wherein a substrate of the first conductivity type with a uniform impurity concentration is used, the dosage of impurities in an active layer of the first conductivity type can be greatly increased. Accordingly, the turn-on resistance can be remarkably decreased while a high breakdown voltage is maintained.

In addition, since the SOI structure is adopted, devices can easily be isolated electrically from one another. Thus, noise can be effectively prevented.

Furthermore, in the high breakdown voltage semiconductor apparatus according to the second aspect of the invention, a drift region is formed without forming a deep well of the second conductivity type. Thus, the drift region can be formed in a step of forming a logic portion. As a result, the step of forming the logic portion can be utilized in many steps. Accordingly, the high breakdown voltage device and low breakdown voltage logic portion can be simultaneously formed, the number of manufacturing steps can be reduced, and the manufacturing cost can be remarkably reduced.

The high breakdown voltage semiconductor apparatus according to the second aspect of the invention will now be described with reference to FIGS. 7 to 14.

Figure 7:
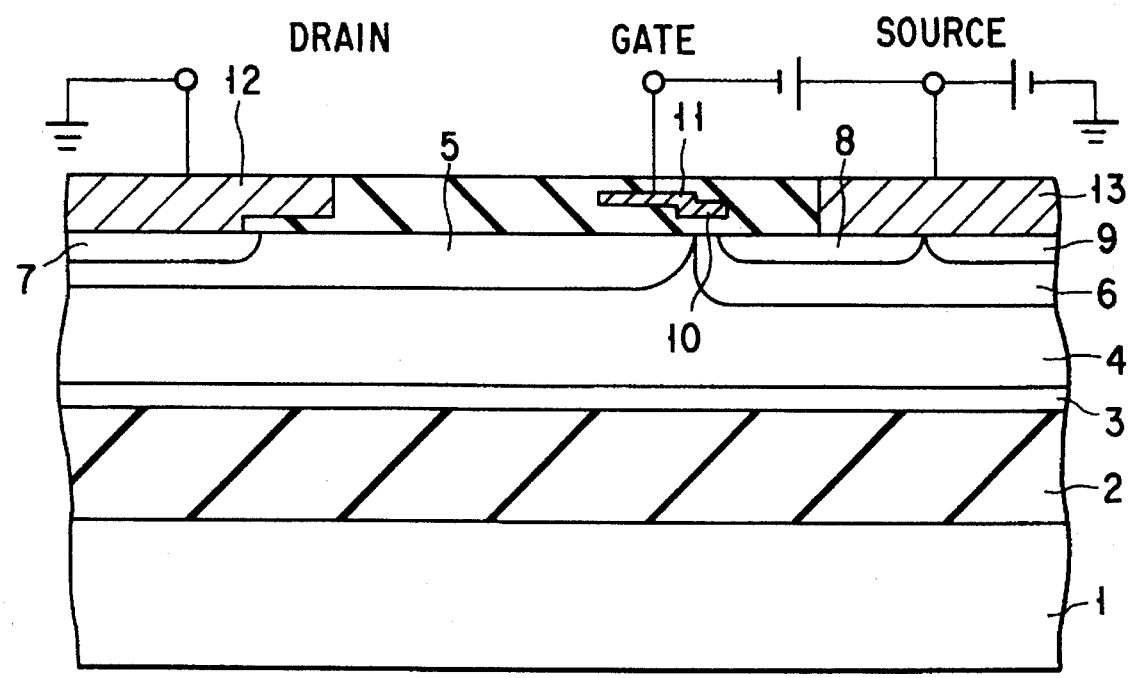
FIG. 7 is a cross-sectional view showing a high breakdown voltage MOSFET according to a first embodiment of a second aspect of the present invention.

FIG. 7 is a cross-sectional view of a high breakdown voltage p channel MOSFET according to a first embodiment of the second aspect of the invention. In FIG. 7, an $SiO_2$ layer 2 is formed on a semiconductor substrate 1. A high resistance n type active layer 3 is formed on the $SiO_2$ layer 2. An n type drift layer 4 is formed on the high resistance n type active layer 3. A p type drift layer 5 is formed on the surface of the n type drift layer 4. In addition, an n type base layer 6 is formed adjacent to the p type drift layer 5 on the surface of the n type drift layer 4. The n type drift layer 4 may reach the oxide layer 2.

A $p^+$-drain region 7 is formed in the p type drift layer 5, and a $p^+$-source region 8 is formed in the n type base layer 6. In addition, an $n^+$-contact region 9 for fixing the potential of the active layer 3 is formed in the n type base layer 6.

A gate insulating film 10 is formed on a region between the p type drift layer 5 and $p^+$-source region 8, and a gate electrode 11 is formed on the gate insulating film 10. A drain electrode 12 is formed on the $p^+$-drain region 7, and a source electrode 13 is formed on the $p^+$-source region 8. A high breakdown voltage p channel MOSFET is thus constituted.

The high breakdown voltage p channel MOSFET having the above structure is fabricated in the following manner.

Two substrates, one of which is provided with an $SiO_2$ layer, are directly bonded to each other, thereby obtaining an SOI-structure semiconductor substrate in which the $SiO_2$ layer 2 and high resistance n type active layer 3 are formed on the n type semiconductor substrate 1. Phosphorus is ion-implanted in the high resistance n type active layer 3 with a dosage of $2\times10^{12}$ cm$^{-2}$ to $3\times10^{12}$ cm$^{-2}$, thus forming the n type drift layer 4. Further, boron is ion-implanted in the n type drift layer 4 to a depth of 1 to 2 µm with a dosage of $1\times10^{12}$ cm$^{-2}$ to $2\times10^{12}$ cm$^{-2}$, thus forming a p type drift layer 5. If the thickness of the p type drift layer 5 is less than 1 µm, the breakdown voltage lowers. If the thickness of the p type drift layer 5 is more than 2 µm, the dosage in the n type drift layer 4 decreases.

Subsequently, the n type base layer 6 (having a thickness of 2 µm when the p type drift layer 5 is 1 µm thick) for forming a p channel and preventing punch-through is formed by using a channel implantation technique for controlling a threshold of a CMOS. Then, the gate insulating film 10, which is 15 nm thick, is formed and a polysilicon is deposited. Thus, the gate electrode 11 is formed on the side of the source region 8, and a field plate is formed on the side of the drain region 7.

Thereafter, using the gate electrode 11 and field plate as mask, boron is ion-implanted in a self-align manner. In the case where the p type drift layer 5 is 1 µm thick, the drain region 7 and source region 8 each having a thickness of 0.5 µm are formed. In order to fix the potential of the active layer 3, the $n^+$-contact region 9 is formed adjacent to the source region 8. Furthermore, the source electrode 13 and drain electrode 12 are formed. Thus, a high breakdown voltage p channel MOSFET is completed.

In the above-described manufacturing process, the manufacturing steps used for forming the CMOS, and not the manufacturing steps used for forming a conventional DMOS, are adopted. This process, therefore, includes many steps common to the steps of forming a low breakdown voltage device such as a logic circuit. FIG. 8 shows an example of the steps for simultaneously forming a high breakdown voltage device (p channel MOSFET) and a low breakdown voltage device (logic portion).

Of the 13 steps illustrated in FIG. 8, 10 steps are common to the manufacture of the p channel MOSFET and logic portion. Thus, the number of steps and the manufacturing time can be greatly reduced.

Figure 9:
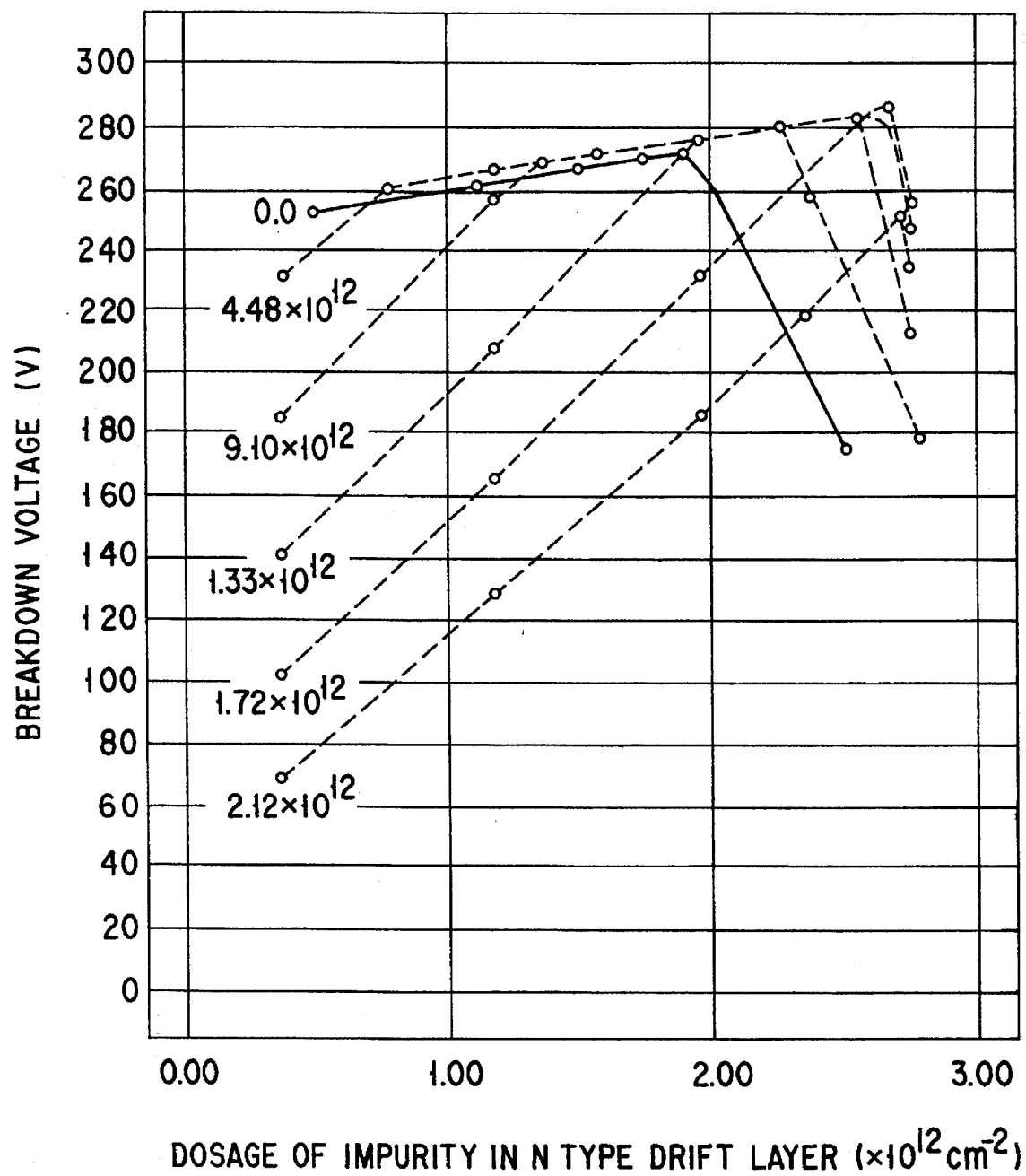
FIG. 9 is a graph showing the variation of the breakdown voltage of the high breakdown voltage MOSFET shown in FIG. 7, in the case where the dosage of impurities in an n type drift layer was varied, with the dosage of impurities in a p type drift layer being used as a parameter.

FIG. 9 shows the breakdown voltage of the high breakdown voltage p channel MOSFET having the above structure in the case where the dosage of impurities in the n type drift layer 4 was varied, with the dosage in the p type drift layer 5 being used as parameter (0 to $2.12\times10^{12}$ cm$^{-2}$). The data shown in FIG. 9 relates to the MOSFET with a drift length of 15 µm, which was formed in the high resistance n type active layer 3 having a thickness of 5 µm. The n type active layer 3 is formed on the $SiO_2$ layer 2 having a thickness of 2 µm.

As can be seen from the graph of FIG. 9, a high breakdown voltage is obtained when the dosage in the n type drift layer 4 is $2\times10^{12}$ cm$^{-2}$ to $3\times10^{12}$ cm$^{-2}$ and the dosage in the p type drift layer 5 is $1\times10^{12}$ cm$^{-2}$ to $2\times10^{12}$ cm$^{-2}$. When the dosage in the p type drift layer 5 is 0, i.e. when the p type drift 5 is not formed, the dosage in the n type drift layer 4 cannot be increased in order to obtain a high breakdown voltage. Thus, the device resistance cannot be decreased. On the other hand, when the dosage in the p type drift layer 5 is $1\times10^{12}$ cm$^{-2}$ to $2\times10^{12}$ cm$^{-2}$, the dosage of the n type drift layer 4 can be increased while a high breakdown voltage is maintained. As a result, the device resistance can be decreased.

Besides, a high breakdown voltage of 500V was obtained in the MOSFET having a drift length of 60 µm, which was formed in the high resistance n type active layer 3 having a thickness of 15 µm. The active layer 3 was formed on the $SiO_2$ layer 2 having a thickness of 3 µm. In this case, the dosage in the n type drift layer 4 was $2.7\times10^{12}$ cm$^{-2}$, and the dosage in the p type drift layer 5 was $1.5\times10^{12}$ cm$^{-2}$.

Figure 10:
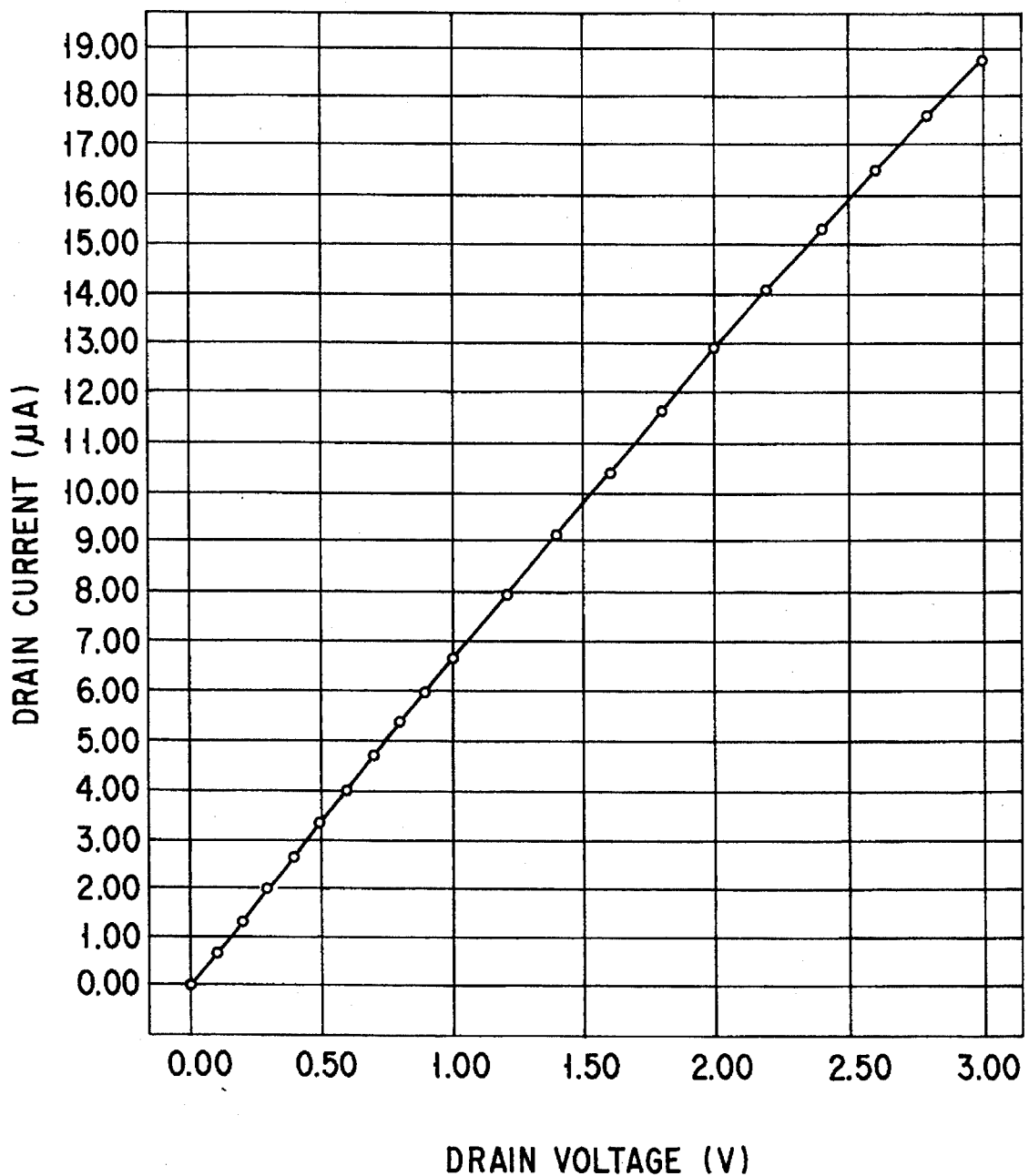
FIG. 10 is a graph showing the relationship between the drain voltage and drain current of the high breakdown voltage MOSFET shown in FIG. 7.
Figure 11:
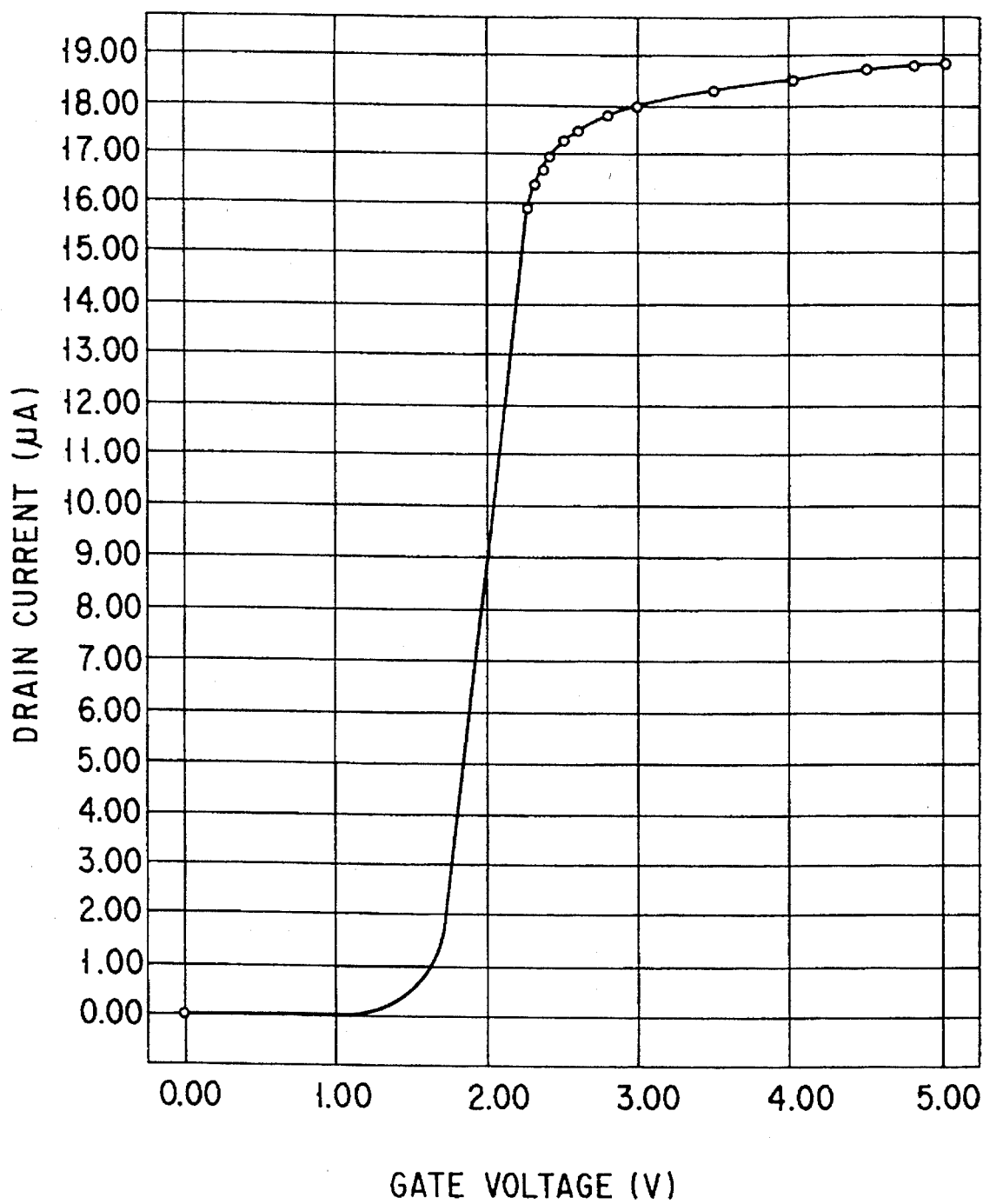
FIG. 11 is a graph showing the relationship between the drain current and gate voltage of the high breakdown voltage MOSFET shown in FIG. 7.

FIG. 10 shows the relationship between the drain voltage and drain current in the case where the gate voltage was 5V, with respect to the above MOSFET. In this case, the turn-on resistance was 180Ω·mm$^2$. FIG. 11 shows the relationship between the drain current and gate voltage in the case where the source-drain voltage was 3V.

Figure 12:
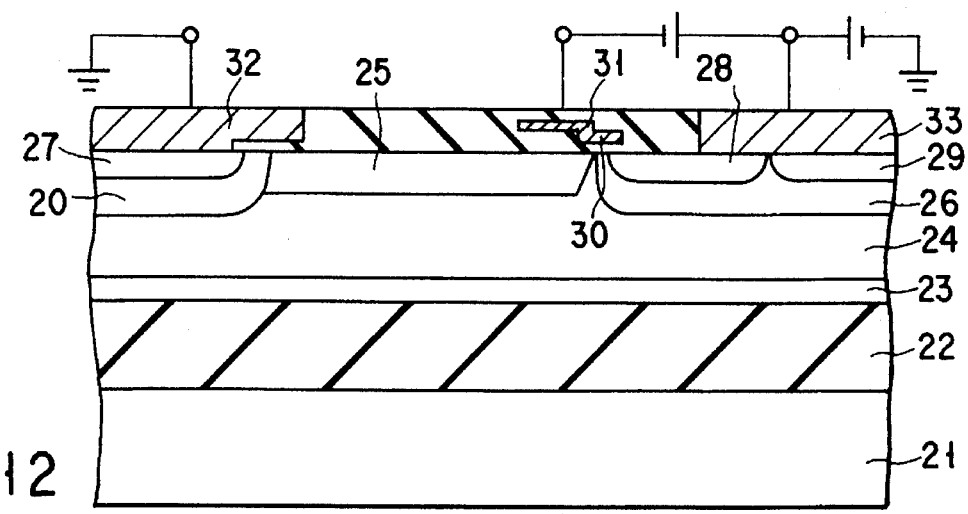
FIG. 12 is a cross-sectional view of an IGBT according to a second embodiment of the second aspect of the invention.

FIG. 12 is a cross-sectional view of an IGBT according to a second embodiment of the second aspect of the invention. In FIG. 12, an $SiO_2$ layer 22 is formed on an n type semiconductor substrate 21, and a high resistance n type active layer 23 is formed on the $SiO_2$ layer 22. An n type drift layer 24 is formed on the high resistance n type active layer 23, and a p type drift layer 25 is formed in a surface portion of the n type drift layer 24. An n type base layer 26 is formed adjacent to the p type drift layer 25 in a surface portion of the n type drift layer 24.

A p type buffer layer 20 is formed in the p type drift layer 25 and n type drift layer 24. An $n^+$-drain region 27 is formed in the p type buffer layer 20, and a $p^+$-source region 28 is formed in the n type base layer 26. An $n^+$-contact region 29 for fixing the potential of the active layer 3 is formed in the n type base layer 26.

A gate insulating film 30 is formed on a region between the p type drift layer 25 and $p^+$-source region 28, and a gate electrode 31 is formed on the gate insulating film 30. A drain electrode 32 is formed on the $p^+$-drain region 27, and a source electrode 33 is formed on the $p^+$-source region 28. An IGBT is thus constituted.

The IGBT shown in FIG. 12 is formed in the same process as the MOSFET shown in FIG. 7, except that the p type buffer layer 20 is formed in the p type drift layer 25 and n type drift layer 24. The p type buffer layer 20 may be formed by ion-injecting boron before or after the field implantation.

Figure 13:
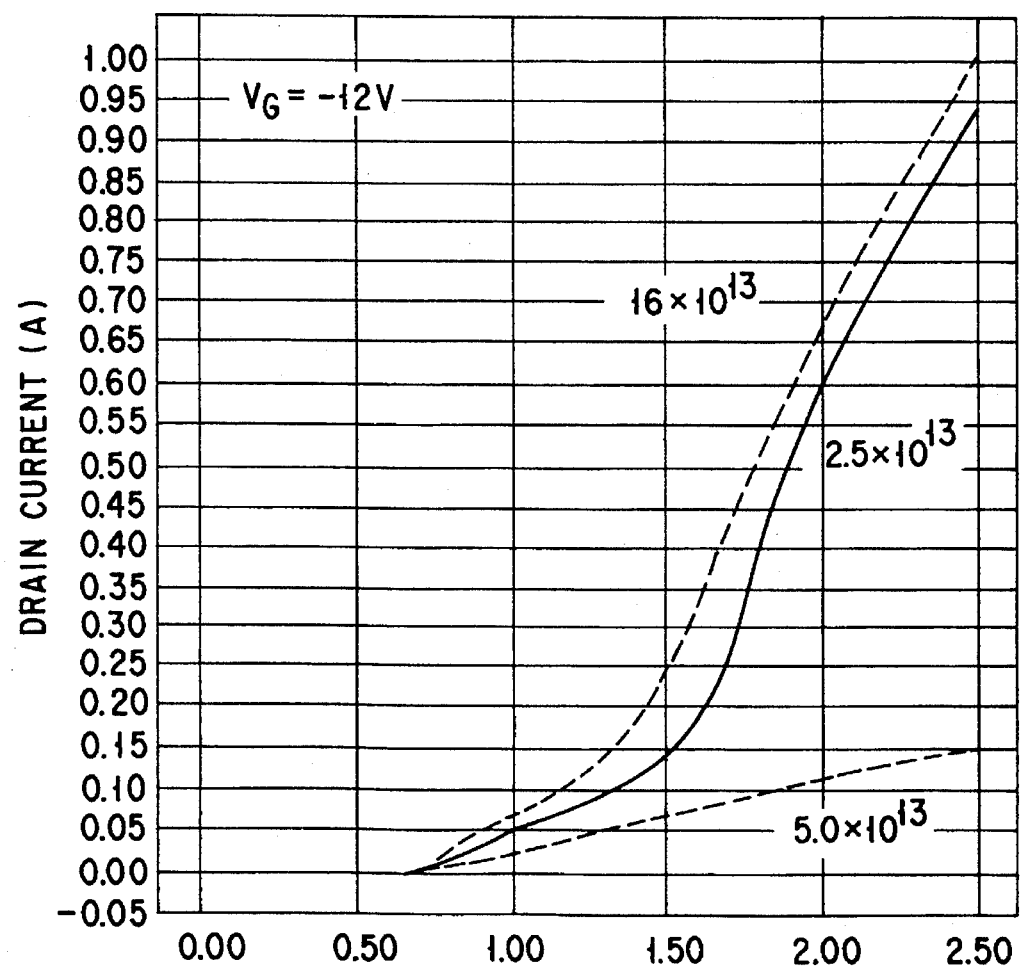
FIG. 13 is a graph showing the relationship between the drain voltage and drain current, when the dosage in the p type buffer layer of the IGBT shown in FIG. 12 was used as a parameter.

FIG. 13 is a graph showing the relationship between the drain voltage and drain current, when the dosage in the p type buffer layer 20 of the IGBT shown in FIG. 12 was used as a parameter. It is understood from FIG. 13 that if the dosage of the p type buffer layer 20 is set at or below $2.5 \times 10^{13}$ cm$^{-2}$, sufficient conductivity modulation can be effected and current/voltage characteristics can be improved. The dosage in the p type buffer layer 20 is preferably $1 \times 10^{13}$ cm$^{-2}$ to $2.5 \times 10^{13}$ cm$^{-2}$.

FIG. 14 is a graph showing a switching waveform of the IGBT shown in FIG. 12. It is understood from FIG. 14 that the switching speed is high, i.e. about 0.5 μsec.

As has been described above, according to the second aspect of the present invention, the shallow drift region of the second conductivity type is formed on the SOI substrate of the first conductivity type. As compared to the case where a substrate of the first conductivity type with a uniform impurity concentration is used, the dosage of impurities in an active layer of the first conductivity type can be greatly increased. Accordingly, the turn-on resistance can be remarkably decreased while a high breakdown voltage is maintained.

In addition, since the SOI structure is adopted, devices can easily be isolated electrically from one another. Thus, noise can be effectively prevented.

Furthermore, a drift region is formed without forming a deep well of the second conductivity type. Thus, the step of forming the logic portion can be utilized in many steps. Accordingly, the high breakdown voltage device and low breakdown voltage logic portion can be simultaneously formed, and the manufacturing cost can be remarkably reduced.

What is claimed is:

1. A high breakdown voltage semiconductor apparatus comprising:

a substrate having an insulating layer formed thereon;

a high resistance semiconductor layer of a first conductivity type formed on said insulating layer;

a base region of a second conductivity type formed selectively in a surface region of said high resistance semiconductor layer;

a source region of the first conductivity type formed in said base region;

a drain region formed in said high resistance semiconductor layer;

a gate electrode formed on a region between said source region and said drain region, with a gate insulating film interposed between said gate electrode and said region between said source region and said drain region;

a source electrode provided in contact with said base region and said source region; and a drain electrode provided in contact with said drain region, wherein a high resistance semiconductor region of the second conductivity type is provided between said insulating layer and said high resistance semiconductor layer of the first conductivity type, and said base region reaches said high resistance semiconductor region of the second conductivity type.

2. The high breakdown voltage semiconductor apparatus according to claim 1, wherein said high resistance semiconductor region of the second conductivity type is directly bonded to said insulating layer.

3. The high breakdown voltage semiconductor apparatus according to claim 1, wherein the thickness of said insulating layer is 1 to 5 μm.

4. The high breakdown voltage semiconductor apparatus according to claim 1, wherein the dosage of impurities in said high resistance semiconductor layer is $1.0 \times 10^{12}$ to $2.0 \times 10^{12}$ cm$^{-2}$.

5. A high breakdown voltage semiconductor apparatus comprising:

a substrate having an insulating layer formed thereon;

a high resistance semiconductor layer of a first conductivity type formed on said insulating layer;

a base region of the first conductivity type formed selectively in a surface region of said high resistance semiconductor layer;

a drift region of a second conductivity type formed selectively in the surface region of said high resistance semiconductor layer so as not to reach said insulating layer;

a source region of the second conductivity type formed in said base region;

a drain region formed in said drift region;

a gate electrode formed on a region between said source region and said drift region, with a gate insulating film interposed between said gate electrode and said region between said source region and said drift region;

a source electrode provided in contact with said base region and said source region;

a drain electrode provided in contact with said drain region, wherein the dosage of impurities in said high resistance semiconductor layer is $2 \times 10^{12}$ cm$^{-2}$ to $3 \times 10^{12}$ cm$^{-2}$ and the dosage of impurities in said drift layer is $1 \times 10^{12}$ cm$^{-2}$ to $2 \times 10^{12}$ cm$^{-2}$.

6. The high breakdown voltage semiconductor apparatus according to claim 5, wherein the thickness of said drift layer is 1 to 2 μm.

7. The high breakdown voltage semiconductor apparatus according to claim 5, wherein said apparatus is a MOSFET.

8. A high breakdown voltage semiconductor apparatus comprising:

a substrate having an insulating layer formed thereon;

a high resistance semiconductor layer of a first conductivity type formed on said insulating layer;

a base region of the first conductivity type formed selectively in a surface region of said high resistance semiconductor layer;

a drift region of a second conductivity type formed selectively in the surface region of said high resistance semiconductor layer so as not to reach said insulating layer;

a source region of the second conductivity type formed in said base region;

a buffer layer of the second conductivity type formed in contact with said drift region;

a drain region of the first conductivity type formed in said buffer region;

a gate electrode formed on a region between said source region and said drift region, with a gate insulating film interposed between said gate electrode and said region between said source region and said drift region;

a source electrode provided in contact with said base region and said source region;

a drain electrode provided in contact with said drain region, wherein the dosage of impurities in said high resistance semiconductor layer is $2 \times 10^{12}$ cm$^{-2}$ to $3 \times 10^{12}$ cm$^{-2}$ and the dosage of impurities in said drift layer is $1\times10^{12}$ cm$^{-2}$ to $2\times10^{12}$ cm$^{-2}$.

9. The high breakdown voltage semiconductor apparatus according to claim 8, wherein the dosage of impurities in said buffer layer is $2.5\times10^{13}$ cm$^{-2}$ or less.

10. The high breakdown voltage semiconductor apparatus according to claim 8, wherein the dosage of impurities in said buffer layer is $1\times10^{13}$ cm$^{-2}$ to $2.5\times10^{13}$ cm$^{-2}$.

* * * * *